United States Patent [19]
Yuen et al.

[11] Patent Number: 5,966,049
[45] Date of Patent: Oct. 12, 1999

[54] BROADBAND LINEARIZER FOR POWER AMPLIFIERS

[75] Inventors: Cindy H. C. Yuen, Saratoga; Steve S. Yang, Newark; Mark D. Adams, Santa Clara; Kirk G. Laursen, Stanford, all of Calif.

[73] Assignee: Space Systems/Loral, Inc., Palo Alto, Calif.

[21] Appl. No.: 09/203,257

[22] Filed: Dec. 1, 1998

[51] Int. Cl.[6] ............................... H03F 1/26; H03F 3/68
[52] U.S. Cl. ........................................ 330/149; 330/124 R
[58] Field of Search .............................. 330/149, 124 R, 330/53

[56] References Cited

U.S. PATENT DOCUMENTS

| 5,291,148 | 3/1994 | Reisner et al. | 330/149 |
| 5,789,978 | 8/1998 | Zhang et al. | 330/149 |

*Primary Examiner*—Benny Lee
*Assistant Examiner*—Patricia Nguyen

*Attorney, Agent, or Firm*—Kenneth W. Float

[57] ABSTRACT

A broadband linearizer for use with a power amplifier. The broadband linearizer includes a broadband linearizer bridge, a preamplifier/attenuator, a post amplifier/attenuator, and a control circuit. The broadband linearizer bridge includes a power divider and a power combiner interconnected by linear and nonlinear arms. The linear arm has a phase shifter, a passive equalizer, and a first delay line that are serially coupled together. The nonlinear arm has a distortion generator, an attenuator and a second delay line that are serially coupled together. The control circuit controls respective settings of the broadband linearizer bridge, preamplifier/attenuator and post amplifier/attenuator. The control circuit provides bias circuitry and sends command and telemetry signals to control operation of the broadband linearizer. The broadband linearizer provides for independent, flexible gain and phase control that can mate with different kinds of power amplifiers having various gain and phase performance.

17 Claims, 2 Drawing Sheets

BROADBAND LINEARIZER FOR POWER AMPLIFIERS

BACKGROUND

The present invention relates generally to power amplifiers, and more particularly, to a broadband linearizer for use with a variety of power amplifiers having different gain and phase performance requirements.

Lockheed Martin Corporation has developed a broadband linearizer design that is implemented using passive FET technology. This broadband linearizer design is discussed in a paper entitled "Linearized Traveling Wave Tube Amplifiers for Space", by Shabbir Moochalla, published in 1998 IEEE MTT-S International Microwave Symposium & Exhibition "Advances in Amplifier Linearization Workshop", and "MMIC Linearizers for C and Ku-Band Satellite Applications" by R. Dorval. The Lockheed Martin approach is a totally different design approach compared to the present invention.

Nippon Electric Company (NEC) manufactures linearizers for use with power amplifiers. Such linearizers are disclosed in "INTELSAT-VII Linearizer for Ku-Band TWTA" report, and "Linearizer for Ku-Band TWTA Performance Specification" (Specification No. E021307). The NEC linearizers use commandable switched frequency bands to cover wide bandwidth. However, the basic design for each band of the NEC linearizer is narrow band.

Conventional linearizers do not provide for independent, flexible gain and phase control using a single design that can mate with different kinds of power amplifiers having various gain and phase performance. Conventional linearizers also do not provide for a simple, compact, low cost design that does not involve complex commandable switched band selection operation.

Accordingly, it would be advantageous to have a broadband linearizer that may be used with a power amplifier that improves the linearity and efficiency performance of the power amplifier across a wide frequency bandwidth. It would also be advantageous to have a broadband linearizer that may be used with a variety of power amplifiers having different gain and phase performance requirements.

SUMMARY OF THE INVENTION

The present invention provides for a broadband linearizer that is a nonlinear circuit located before a power amplifier that improves the linearity and efficiency performance of the power amplifier across a wide frequency bandwidth. The design of the broadband linearizer may be used at any frequency band such as L, C, X, Ku, K, Ka, Q, V or W-band. The broadband linearizer also may be used with any type of power amplifier such as a travelling wave tube amplifier (TWTA) or solid state power amplifier (SSPA), for example.

The gain compression and phase lag/advance of every high efficiency travelling wave tube amplifier (TWTA) or solid state power amplifier (SSPA) vary differently with respect to input power level and across wide frequency bandwidth. The linearizer characteristics are shaped to complement the characteristics of the TWTA or SSPA to which they are mated as a function of both input power level and frequency.

The present broadband linearizer design has independent controls for gain expansion (or compression) and phase advance (or lag) with respect to input power and over wide bandwidth. This compensates for the nonlinearity of power amplifiers with various gain and phase performance over input power range and across a wide bandwidth.

The broadband linearizer is flexible to compensate power amplifiers with various types of gain and phase performance. The broadband linearizer has independent controls of gain and phase over input power level and across an extremely wide bandwidth (>30%). The broadband linearizer is based on a linearizer design disclosed in U.S. Pat. No. 5,789,978 assigned to the assignee of the present invention, and is enhanced to cover the wide bandwidth requirements for various power amplifiers. The broadband linearizer may be realized on a compact size, single alumina substrate to minimize production costs.

One advantage of the present broadband linearizer over other broadband linearizer designs is that it provides for independent, flexible gain expansion and phase advance (lag) control that translates to a single design that can mate with different kinds of power amplifiers having various gain and phase performance. Another advantage of the present broadband linearizer over other broadband linearizer designs is that it provides for simple, compact, low cost design that does not involve complex commandable switched band selection operation.

BRIEF DESCRIPTION OF THE DRAWINGS

The various features and advantages of the present invention may be more readily understood with reference to the following detailed description taken in conjunction with the accompanying drawings, wherein like reference numerals designate like structure element, and in which.

DETAILED DESCRIPTION

Figure 1:
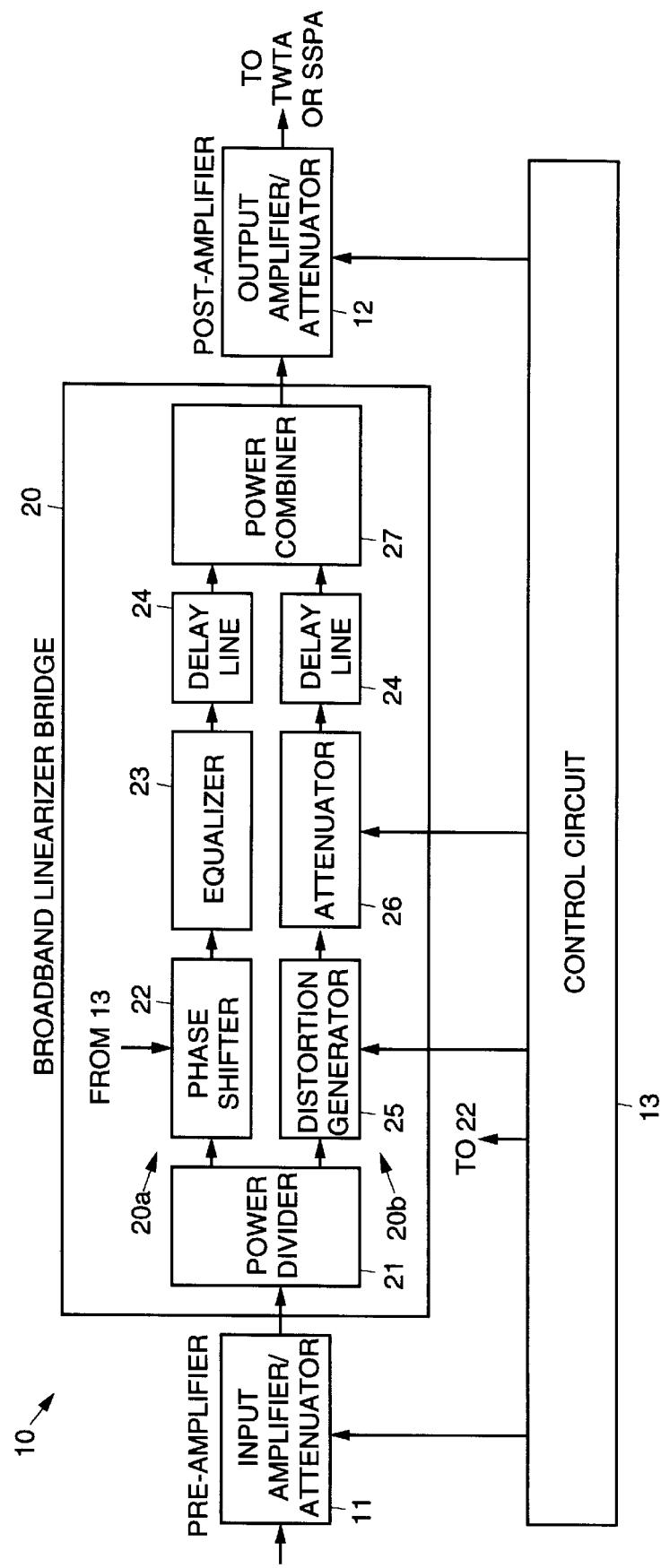
FIG. 1 is a block diagram that illustrates a broadband linearizer in accordance with the principles of the present invention.

Referring to the drawing figures, FIG. 1 illustrates an exemplary embodiment of a broadband linearizer 10 in accordance with the principles of the present invention. The broadband linearizer 10 comprises a broadband linearizer bridge 20, a preamplifier/attenuator 11, a post amplifier/attenuator 12, and a control circuit 13. The control circuit 13 is coupled to the broadband linearizer bridge 20, preamplifier/attenuator 11 and post amplifier/attenuator 12 and controls the respective settings thereof. In particular, the control circuit 13 provides bias circuitry and sends command and telemetry signals to control operation of the broadband linearizer 10.

The broadband linearizer bridge 20 comprises a power divider 21 and a power combiner 27 interconnected by two paths 20a, 20b or arms 20a, 20b. One arm 20a is a linear arm 20a comprising a phase shifter 22, a passive equalizer 23, and a first delay line 24. The other arm 20b is a nonlinear arm 20b comprising a distortion generator 25, an attenuator 26 and a second delay line 24. The control circuit 13 is coupled to the 30 phase shifter 22, the distortion generator 25, the attenuator 26, the input amplifier/attenuator 11 and the output amplifier/attenuator 12 and controls the respective settings thereof.

Figure 2:
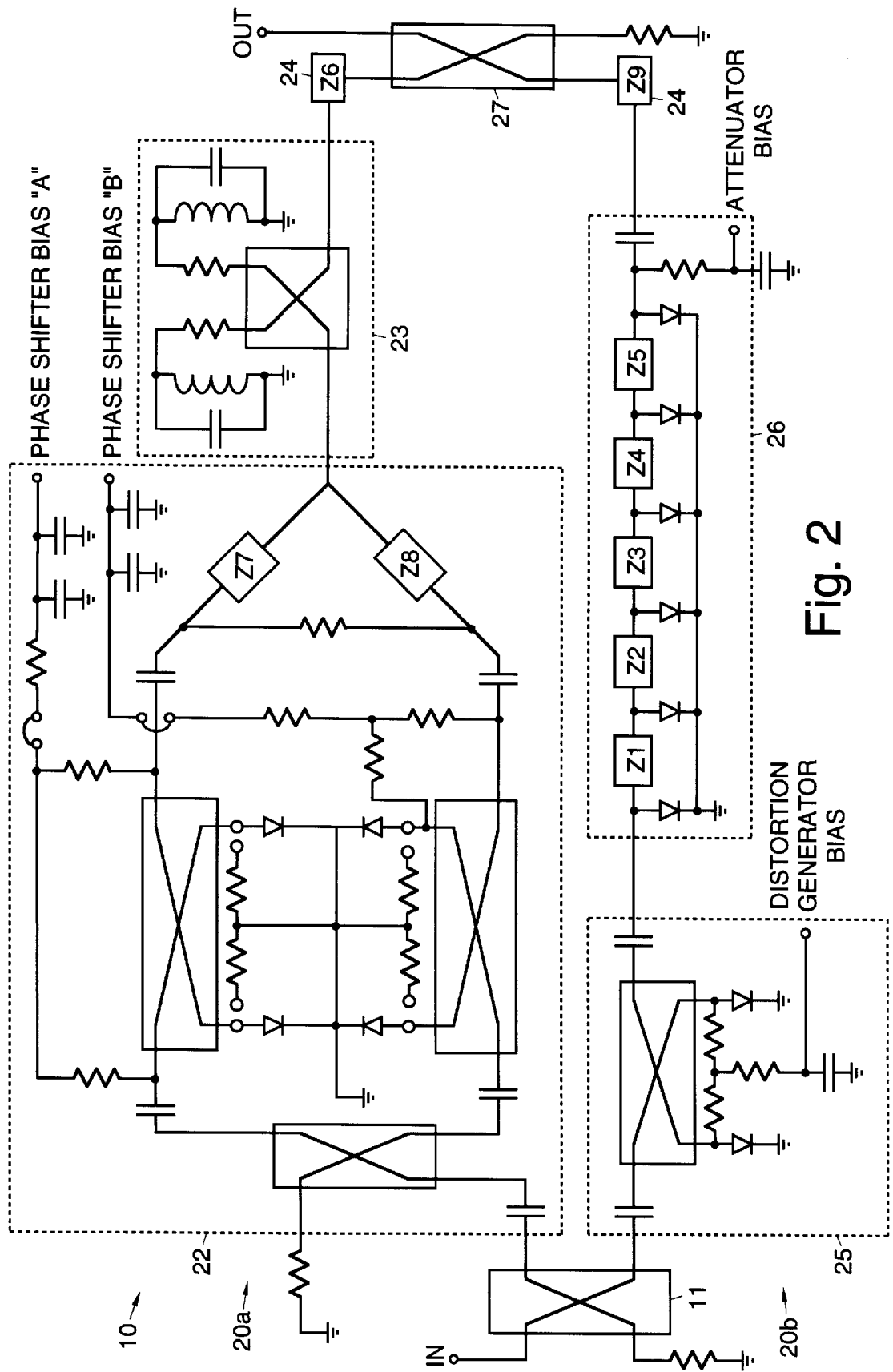
FIG. 2 illustrates a detailed schematic diagram of the broadband linearizer of FIG. 1.

FIG. 2 illustrates a detailed schematic diagram of the exemplary embodiment of the broadband linearizer 10 shown in FIG. 1. The delay line 24 comprises a bent 50 ohm line, which is employed to compensate the delay between the linear and nonlinear arms 20a, 20b, reduce dispersion and improve the operating frequency band. The phase shifter 22 comprises two pairs of PIN diode reflection attenuators. This circuit provides 360° phase shifting with constant insertion loss. Details of the construction of the phase shifter 22 may be found in U.S. Pat. No. 5,317,288, the contents of which are incorporated herein by reference. The nonlinear distortion generator 25 comprises a Lange coupler and two diodes to form a balanced reflection circuit. With properly applied DC bias, this circuit works at low power levels as well as higher power levels. In addition, the gain curve can be easily manipulated by selection of the DC bias level applied to the distortion generator 25. The attenuator 26 comprises six PIN diodes and is used to adjust the output power of the nonlinear arm 20b. In bypass mode, the attenuator 26 provides greater than 35 dB attenuation, which makes the linearizer bridge 20 a linear circuit.

The linearizer bridge 20 operates as follows. The linearizer bridge 20 has two operational modes; active mode and bypass mode. In the active mode, the linearizer bridge 20 functions as a nonlinear circuit that provides up to 10 dB gain expansion with up to 90° phase advance. The gain expansion value and phase advance value are controlled by the phase shifter 22 and attenuator 26. In addition, the gain curve may be adjusted by changing the bias supplied to the distortion generator 25. In the bypass mode, the attenuator 26 provides high attenuation in the nonlinear arm 20b. Therefore, the linearizer bridge 20 functions as a linear circuit.

While the phase shifter 22 in the exemplary embodiment of the linearizer 10 has been disclosed as a diode-based phase shifter 22, it is to be understood that other types of phase shifters 22 may also be used in the linearizer 10. For example, the phase shifter 22 may employ GaAs FETs, varactor diodes, or ferrite phase shift elements, for example. Similarly, while the exemplary delay lines 24 are passive circuits, it is to be understood that active delay lines 24 that employ transistor or diode switches, for example, may also be used in the linearizer 10. Also, while the exemplary equalizer 23 has been disclosed as a passive equalizer 23 containing a RLC network, it is to be understood that an active equalizer 23 that employs transistors or diodes, for example, may also be used in the linearizer 10. Furthermore, while the exemplary attenuator 26 has been disclosed as diode-based, it is to be understood that an attenuator 26 using FETs, for example, may also be employed. Similarly, while the exemplary distortion generator 25 uses diodes, it is to be understood that a distortion generator 25 using FETs, for example, may also be employed. Accordingly, the present invention is not limited to the specifically disclosed components used in the exemplary embodiment of the linearizer 10.

The operating principles of the broadband linearizer 10 are described below. The setting of the distortion generator 25 set by the control circuit 13 controls the curvature of gain expansion (or compression) and phase advance (or lag) versus input power applied to the broadband linearizer 10.

The setting (in degrees) of the phase shifter 22 set by the control circuit 13 controls the gain expansion (or compression) versus input power at one frequency. A larger phase difference between two arms 20a, 20b causes a higher gain expansion.

The setting (in dB) of the attenuator 26 set by the control circuit 13 controls the phase advance (or lag) versus input power at one frequency. A larger attenuation setting in the nonlinear arm 20b causes a lower phase advance.

The setting (+/−dB/GHz) of the passive equalizer 23 is determined by selecting various values of an RLC network and controls the variations of phase advance (or lag) versus input power across a wide frequency bandwidth. A negative gain slope of the passive equalizer 23 in the linear arm 20a causes a phase advance (or lag) increase with frequency.

The settings (+/−deg/GHz) of the first and second delay lines 24 control the variations of gain expansion (or compression) versus input power across a wide frequency bandwidth. A longer electrical delay of the linear arm 20a causes a gain expansion (or compression) decrease with frequency.

The preamplifier/attenuator 11 is adjusted by the control circuit 13 to couple a desired input power level into the broadband linearizer bridge 20.

The post-amplifier/attenuator 12 is adjusted by the control circuit 13 to couple a desired output power level from the broadband linearizer 10 to a travelling wave tube amplifier (TWTA) or solid state power amplifier (SSPA), for example, coupled to an output of the broadband linearizer 10.

By combining the signals from both the linear and nonlinear arms 20a, 20b in the power combiner 27 using appropriate settings as described above, the broadband linearizer 10 can independently compensate the gain and phase requirements over the input power range and across a wide bandwidth for performance requirements of different types of power amplifiers.

Simulations of various operations of the broadband linearizer 10 are shown in accompanying Tables 1–4. All results refer to the linearizer gain and phase performance corresponding to the power amplifier saturation point. Table 1 shows results for varying phase shifter settings while holding everything else constant. Table 2 shows results for varying the attenuator settings while holding everything else constant. Table 3 shows results for varying equalizer settings. Table 4 shows results for varying the linear arm delay line length.

The present invention provides for a flexible broadband linearizer 10 that may be realized on a compact size, single alumina substrate, for example, to minimize production cost.

The broadband linearizer 10 may be used to process signals in any frequency band, such as L, C, X, Ku, K, Ka, Q, V or W bands. The broadband linearizer 10 may be used with different types of power amplifiers such as travelling wave tube amplifiers (TWTA) and solid state power amplifiers (SSPA), for example.

Thus, a broadband linearizer that may be used with a power amplifier to improve the linearity and efficiency performance of the power amplifier across a wide frequency bandwidth has been disclosed. It is to be understood that the described embodiment is merely illustrative of some of the many specific embodiments that represent applications of the principles of the present invention. Clearly, numerous and other arrangements can be readily devised by those skilled in the art without departing from the scope of the invention.

TABLE 1

Varying phase, everything else constant (no equalizer or delay lines)

| Phase Shifter Phase Setting (deg) | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 180 | | −1.22 | | 12.88 | 12.88 | −12.33 | −12.33 |
| 175 | | −1.22 | | 11.78 | 11.78 | 13.83 | 13.83 |
| 170 | | −1.22 | | 9.51 | 9.51 | 27.88 | 27.88 |
| 165 | | −1.22 | | 7.47 | 7.47 | 33.66 | 33.66 |
| 160 | | −1.22 | | 5.86 | 5.86 | 35.59 | 36.59 |
| 155 | | −1.22 | | 4.60 | 4.60 | 35.71 | 36.71 |
| 135 | | −1.22 | | 1.61 | 1.61 | 30.99 | 30.99 |
| 120 | | −1.22 | | 0.45 | 0.45 | 28.79 | 26.79 |
| 90 | | −1.22 | | −0.82 | −0.82 | 19.79 | 9.79 |
| 30 | | −1.22 | | −1.95 | −1.95 | 9.51 | 9.51 |
| 0 | | −1.22 | | −2.26 | −2.26 | 4.01 | 4.91 |
| −30 | | −1.22 | | −2.48 | −2.48 | −0.06 | −0.06 |

TABLE 2

Varying distributed gain and base gain, everything else constant (no equalizer or delay lines)

| Phase Shifter Phase Setting (deg) | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 160 | | −0.72 | | 5.86 | 5.86 | 42.11 | 42.11 |
| 160 | | −1.22 | | 5.86 | 5.86 | 35.59 | 35.59 |
| 160 | | −1.72 | | 5.72 | 5.72 | 29.81 | 29.81 |

TABLE 3

With linear arm equalizer, varying equalization level, everything else constant (no delay lines)

| Phase Shifter Phase Setting (deg) | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 160 | 3.0 | −1.22 | | 5.86 | 3.33 | 35.59 | 7.60 |
| 160 | 2.0 | −1.22 | | 5.86 | 4.19 | 35.59 | 12.28 |
| 160 | 1.5 | −1.22 | | 5.86 | 4.67 | 35.59 | 15.88 |
| 160 | 1.0 | −1.22 | | 5.86 | 5.16 | 35.59 | 20.75 |
| 160 | 0.5 | −1.22 | | 5.86 | 5.60 | 35.59 | 27.74 |
| 160 | 0.0 | −1.22 | | 5.86 | 5.86 | 35.59 | 35.59 |
| 160 | −0.5 | −1.22 | | 5.86 | 5.78 | 35.59 | 45.59 |
| 160 | −1.0 | −1.22 | | 5.86 | 5.21 | 35.59 | 58.02 |
| 160 | −1.5 | −1.22 | | 5.86 | 4.13 | 35.59 | 65.34 |
| 160 | −2.0 | −1.22 | | 5.86 | 2.68 | 35.59 | 72.20 |
| 160 | −3.0 | −1.22 | | 5.86 | −0.50 | 35.59 | 77.38 |

TABLE 4

Linear arm delay increasing in length, everything else constant (no equalizer)

| Phase Shifter Phase Setting (deg) | Linear Branch Equalizer Setting (dG/dF) | Attenuator Setting (dB) | Linear Delay Line Setting (deg/GHz) | Gain Exp. (dB) at 11.0 GHz | Gain Exp. (dB) at 12.5 GHz | Phase Adv. (deg) at 11.0 GHz | Phase Adv. (deg) at 12.5 GHz |
|---|---|---|---|---|---|---|---|
| 160 | | −1.22 | 0.00 | 5.86 | 5.86 | 35.59 | 35.59 |
| 160 | | −1.22 | −5.00 | 5.86 | 4.08 | 35.59 | 35.40 |
| 160 | | −1.22 | −10.00 | 5.86 | 2.81 | 35.59 | 33.78 |
| 160 | | −1.22 | −15.00 | 5.86 | 1.87 | 35.59 | 31.71 |
| 160 | | −1.22 | −20.00 | 5.86 | 1.16 | 35.59 | 29.55 |
| 160 | | −1.22 | −25.00 | 5.86 | 0.01 | 35.59 | 27.45 |
| 160 | | −1.22 | −30.00 | 5.86 | 0.17 | 35.59 | 25.49 |
| 160 | | −1.22 | −35.00 | 5.86 | −0.20 | 35.59 | 23.64 |
| 160 | | −1.22 | −40.00 | 5.86 | −0.50 | 35.59 | 21.91 |
| 160 | | −1.22 | −45.00 | 5.86 | −0.75 | 35.59 | 20.30 |

What is claimed is:

1. A broadband linearizer comprising:
   a broadband linearizer bridge comprising a power divider and a power combiner interconnected by linear and nonlinear arms, which linear arm comprises an equalizer;
   a preamplifier/attenuator;
   a post amplifier/attenuator; and
   a control circuit for controlling respective settings of the broadband linearizer bridge, preamplifier/attenuator and post amplifier/attenuator.

2. The broadband linearizer recited in claim 1 wherein the linear arm comprises a phase shifter, a passive equalizer, and a first delay line that are serially coupled together.

3. The broadband linearizer recited in claim 1 wherein the nonlinear arm comprises a distortion generator, an attenuator and a second delay line that are serially coupled together.

4. The broadband linearizer recited in claim 3 wherein the control circuit provides bias circuitry and sends command and telemetry signals to control operation of the broadband linearizer.

5. The broadband linearizer recited in claim 1 whose components are designed for use at frequency bands included L, C, X, Ku, K, Ka, Q, and W-band.

6. The broadband linearizer recited in claim 4 whose components are designed for use at frequency bands included L, C, X, Ku, K, Ka, Q, and W-band.

7. The broadband linearizer recited in claim 1 wherein the preamplifier/attenuator is adjustable by the control circuit to couple a desired input power level into the broadband linearizer bridge.

8. The broadband linearizer recited in claim 1 wherein the post-amplifier/attenuator is coupled to an amplifier, and the post-amplifier/attenuator is adjustable by the control circuit to couple a desired output power level from the broadband linearizer to the amplifier.

9. The broadband linearizer recited in claim 1 wherein the amplifier comprises a travelling wave tube amplifier.

10. The broadband linearizer recited in claim 1 wherein the amplifier comprises a solid state power amplifier.

11. A broadband linearizer comprising:
    a broadband linearizer bridge comprising:
    a power divider;
    a power combiner;
    a linear arm comprising a phase shifter, a passive equalizer, and a first delay line that are serially coupled together; and
    a nonlinear arm comprising a distortion generator, an attenuator 26 and a second delay line that are serially coupled together;
    a preamplifier/attenuator;
    a post amplifier/attenuator; and
    a control circuit for controlling respective settings of the broadband linearizer bridge, preamplifier/attenuator and post amplifier/attenuator.

12. The broadband linearizer recited in claim 11 wherein the control circuit provides bias circuitry and sends command and telemetry signals to control operation of the broadband linearizer.

13. The broadband linearizer recited in claim 11 whose components are designed for use at frequency bands included L, C, X, Ku, K, Ka, Q, and W-band.

14. The broadband linearizer recited in claim 11 wherein the preamplifier/attenuator is adjustable by the control circuit to couple a desired input power level into the broadband linearizer bridge.

15. The broadband linearizer recited in claim 11 wherein the post-amplifier/attenuator is coupled to an amplifier, and the post-amplifier/attenuator is adjustable by the control circuit to couple a desired output power level from the broadband linearizer to the amplifier.

16. The broadband linearizer recited in claim 11 wherein the amplifier comprises a travelling wave tube amplifier.

17. The broadband linearizer recited in claim 11 wherein the amplifier comprises a solid state power amplifier.

* * * * *